(12) United States Patent
Strzalkowski et al.

(10) Patent No.: US 7,560,833 B2
(45) Date of Patent: Jul. 14, 2009

(54) DRIVE CIRCUIT HAVING A TRANSFORMER FOR A SEMICONDUCTOR SWITCHING ELEMENT

(75) Inventors: Bernhard Strzalkowski, Munich (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 206 days.

(21) Appl. No.: 11/541,446

(22) Filed: Sep. 29, 2006

(65) Prior Publication Data

US 2007/0081280 A1 Apr. 12, 2007

(30) Foreign Application Priority Data

Sep. 30, 2005 (DE) .................. 10 2005 047 055

(51) Int. Cl.
*H01H 47/00* (2006.01)
*H01H 9/54* (2006.01)
*H01L 27/04* (2006.01)
*H01L 29/02* (2006.01)

(52) U.S. Cl. .................. 307/113; 307/139; 257/531

(58) Field of Classification Search .................. 307/139, 307/113; 257/531
See application file for complete search history.

(56) References Cited

U.S. PATENT DOCUMENTS 5,310,701 A * 5/1994 Kaussen et al. ............... 29/834
5,448,100 A * 9/1995 Beasom ....................... 257/487
5,969,405 A * 10/1999 Aeugle ......................... 257/531
5,969,964 A * 10/1999 Mangtani ..................... 363/132
6,462,603 B1 * 10/2002 Pong et al. ................... 327/365
6,720,816 B2 * 4/2004 Strzalkowski ............... 327/307
6,836,161 B2 * 12/2004 Akiyama et al. ............. 327/108

FOREIGN PATENT DOCUMENTS

| DE | 102 05 705 C1 | 5/2003 |
| DE | 102 32 642 A1 | 2/2004 |
| DE | 10 2004 035 604 B3 | 8/2005 |

* cited by examiner

*Primary Examiner*—Albert W Paladini
*Assistant Examiner*—Hal I Kaplan
(74) *Attorney, Agent, or Firm*—Maginot, Moore & Beck

(57) ABSTRACT

A drive circuit for a semiconductor switching element includes a transformer, first and second driver circuits, and a rectifier element. The drive circuit produces a drive signal based on an input signal. The transformer has a primary winding and a secondary winding, and is integrated in a first semiconductor body. The first driver circuit is coupled to receive the input signal, and has at least one output which is coupled to the primary winding of the transformer. The first driver circuit also includes a first supply input connected to receive a first supply potential. The second driver circuit is operable to provide the drive signal and has at least one input coupled to the secondary winding. The second driver circuit has a second supply input. The rectifier element is connected between the first and the second supply input, and is integrated in the first semiconductor body.

20 Claims, 7 Drawing Sheets

FIG 4
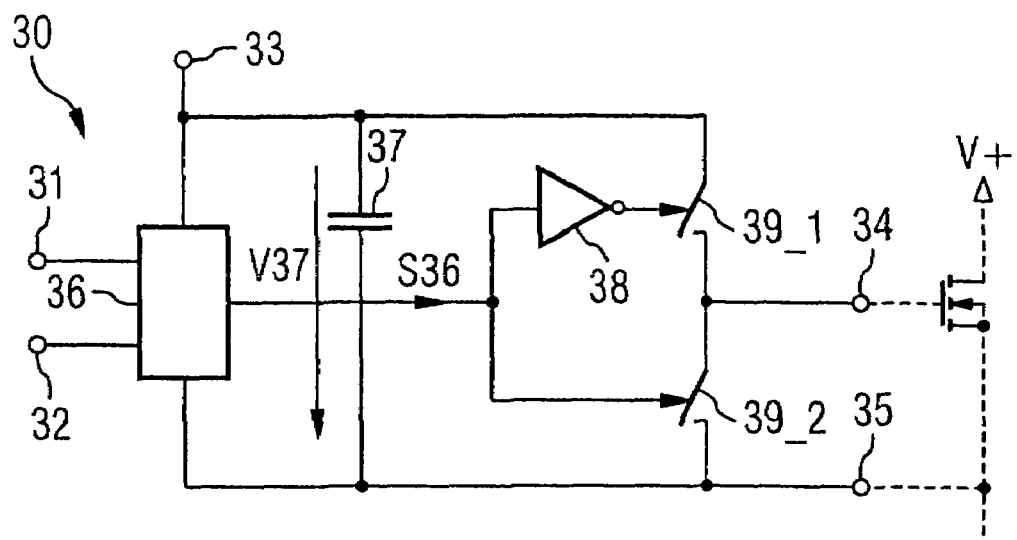
FIG 5  A-A
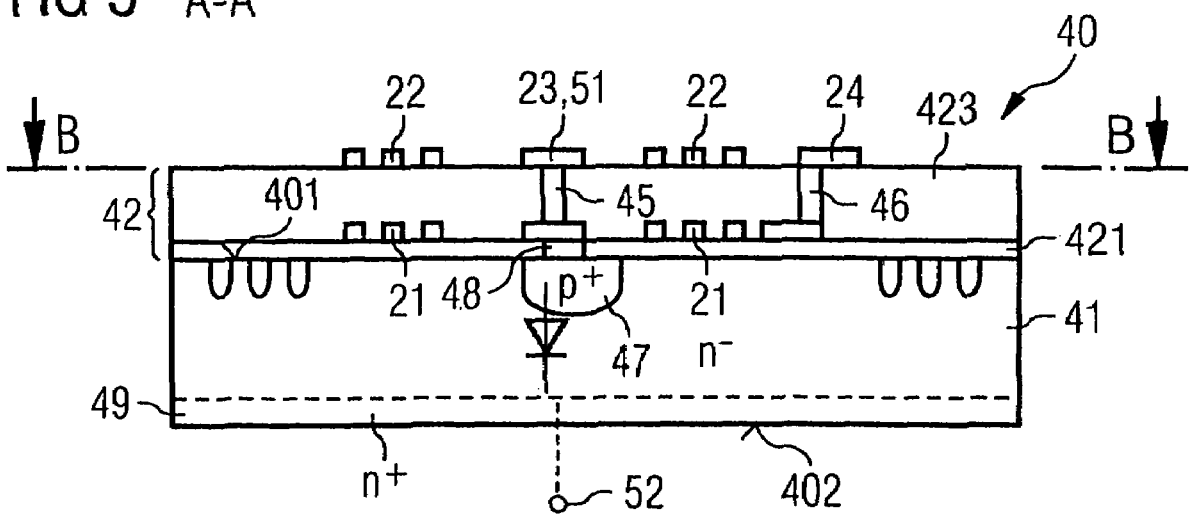

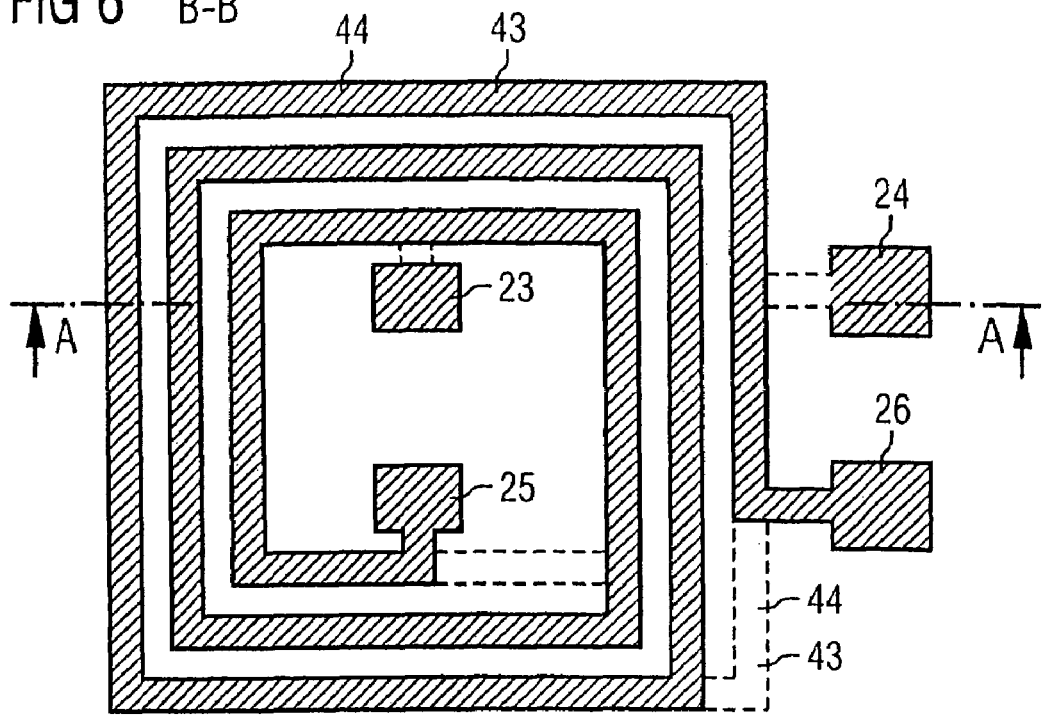
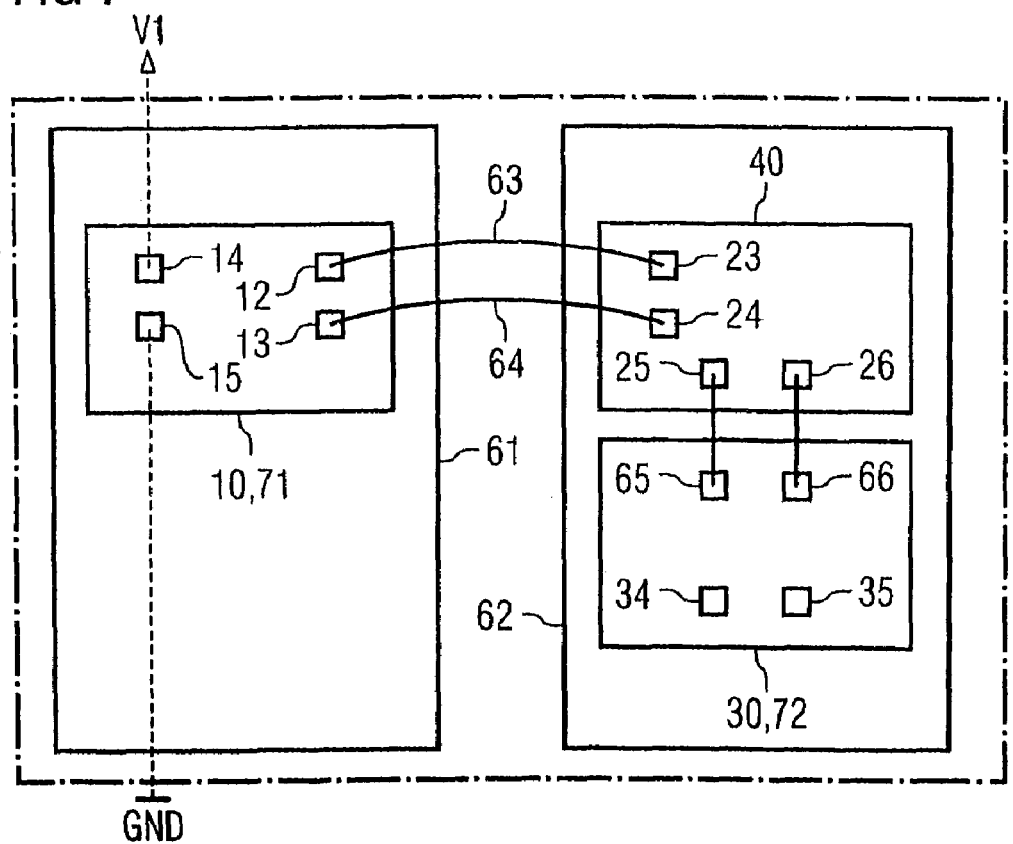

DRIVE CIRCUIT HAVING A TRANSFORMER FOR A SEMICONDUCTOR SWITCHING ELEMENT

FIELD OF THE INVENTION

The present invention relates to a drive circuit for a semiconductor switching element, in particular for a semiconductor switching element which may be used as a high-side switch.

BACKGROUND

As is known, the expression high-side switch is used for a switch or a semiconductor switching element whose load path is connected in series with a load between terminals for a positive and a negative supply potential, and one of whose load path connections is connected to the terminal for the positive supply potential. The potential at the other of the two load path connections is in this case dependent on the switching state of the high-side switch, and can rise approximately to the value of the positive supply potential when the high-side switch is switched on.

In the case of a power MOSFET or a power IGBT, the drain-source path through the component forms its load path. When an n-channel power MOSFET or a power IGBT is used as a high-side switch, its drain connection is connected to the terminal for the positive supply potential, so that the drain potential corresponds to the positive supply potential. The source potential of the component is then variable, and depends on the switching state of the component.

With regard to the driving of an n-MOSFET or IGBT such as this which is used as a high-side switch, one problem that arises is that a drive potential must be available at the gate connection which is used as the drive connection, in order to switch the component on, and which drive potential must be greater than the value of the source potential at least by the value of the threshold voltage of the component.

Modern power transistors can be used to switch voltages of up to several 10 kV, so that correspondingly high drive potentials must be available, in each case with respect to the negative supply potential or reference ground potential.

It is known for a driver circuit to be provided in order to produce a drive signal for a high-side switch such as this, with this driver circuit producing a drive signal with respect to the source potential, as a function of an input signal which is supplied to the driver circuit. This input signal can be produced by means of a level shifter from a logic signal which is supplied from a signal processing circuit and is normally related to a reference ground potential. The level shifter is used to convert the logic signal to an input signal for the driver circuit, with this input signal being related to the source potential of the high-side switch.

In order to decouple the high potential which is required at the output of the driver circuit to switch on the high-side switch from the logic potential in the signal processing circuit, it is known, for example from DE 102 05 705 C1 or from DE 10 2004 035 604 B3 for a potential barrier to be provided in the form of a transformer, and for the logic signal to be transmitted to the input of the driver circuit via this potential barrier.

One integrated transformer arrangement, which can be produced in a space-saving form, is described by way of example in DE 102 32 642 A1.

A further problem in the production of a drive signal for a high-side switch is the provision of an adequate voltage supply for the driver for the high-side switch. In this case, an upper supply potential for this driver must assume values above the positive supply potential of the load circuit in order to ensure that the drive signal is produced when the high-side switch is switched on. One possible way to produce this voltage supply is to use a bootstrap circuit, which has been known for a long time, with a bootstrap diode and a bootstrap capacitor. A bootstrap circuit such as this can produce a supply voltage for the high-side driver from a low supply voltage which is related to the negative supply potential.

SUMMARY OF THE INVENTION

The drive circuit according to an embodiment of the invention for driving a semiconductor switching element has an input for supplying an input signal, an output for production of a drive signal for the semiconductor switching element, a first and a second driver circuit, as well as a transformer.

In a first embodiment, a drive circuit for a semiconductor switching element includes a transformer, first and second driver circuits, and a rectifier element. The drive circuit produces a drive signal based on an input signal. The transformer has a primary winding and a secondary winding, and is integrated in a first semiconductor body. The first driver circuit is coupled to receive the input signal, and has at least one output which is coupled to the primary winding of the transformer. The first driver circuit also includes a first supply input connected to receive a first supply potential. The second driver circuit is operable to provide the drive signal and has at least one input coupled to the secondary winding. The second driver circuit has a second supply input. The rectifier element is connected between the first and the second supply input, and is integrated in the first semiconductor body.

Other embodiments include arrangements including such a driver circuit and a semiconductor switching element, and methods of using similar circuits.

BRIEF DESCRIPTION OF THE DRAWINGS

Embodiments of the present invention will be explained in more detail in the following text with reference to figures, in which:

FIG. 4 shows one possible implementation example for the second driver circuit.

FIG. 5 shows, in the form of a side view, a cross section through a semiconductor body having a transformer integrated in it and having a rectifier element which is integrated in it and is in the form of a diode.

FIG. 6 shows the semiconductor body shown in FIG. 4, in the form of a cross section on a section plane B-B.

FIG. 7 shows one example of the implementation of the drive circuit illustrated in FIG. 1, at chip level.

DETAILED DESCRIPTION OF THE DRAWINGS

Unless stated to the contrary, identical reference symbols in the figures denote identical circuit parts, component areas and signals with the same meaning.

For the purposes of the disclosure of embodiments of the present invention, integration of the transformer in the semiconductor body means that the primary winding and the secondary winding are embedded in semiconductor areas of the semiconductor body, or that the primary winding and the secondary winding are embedded in isolation layers above the semiconductor body. Integration of a transformer in this way in a semiconductor body is in principle known, and is described in the initially cited DE 102 32 642 A1.

The transformer in the embodiments described herein may be a transformer without a winding core (coreless transformer).

In the drive circuit of at least some embodiments of the invention, the transformer acts as a potential barrier between the first driver circuit, to which the input signal is supplied, and the second driver circuit, which produces the drive signal for the semiconductor switching element. The first driver circuit is in this case designed to convert the input signal to a signal which is suitable for transmission via the transformer, while the second driver circuit is designed to convert a signal which has been received via the transformer to the drive signal which is suitable for driving the semiconductor switching element.

The rectifier element of at least some embodiments of the invention may be in the form of a diode. In any event, the rectifier element is integrated together with the transformer in the first semiconductor body, is used to supply voltage to the second driver circuit and is, for example, part of a so-called bootstrap circuit, which has a bootstrap capacitor.

The integration of the transformer and of the rectifier element in a common semiconductor body makes it possible to provide a potential barrier at low cost and in a space-saving manner between the first and the second driver circuit, and on the other hand to provide a voltage supply for the second driver circuit.

The drive circuit according to the at least some embodiments of the invention is particularly suitable for driving a semiconductor switching element that is used as a high-side switch in a half-bridge circuit or in a three-phase bridge circuit.

Figure 1:
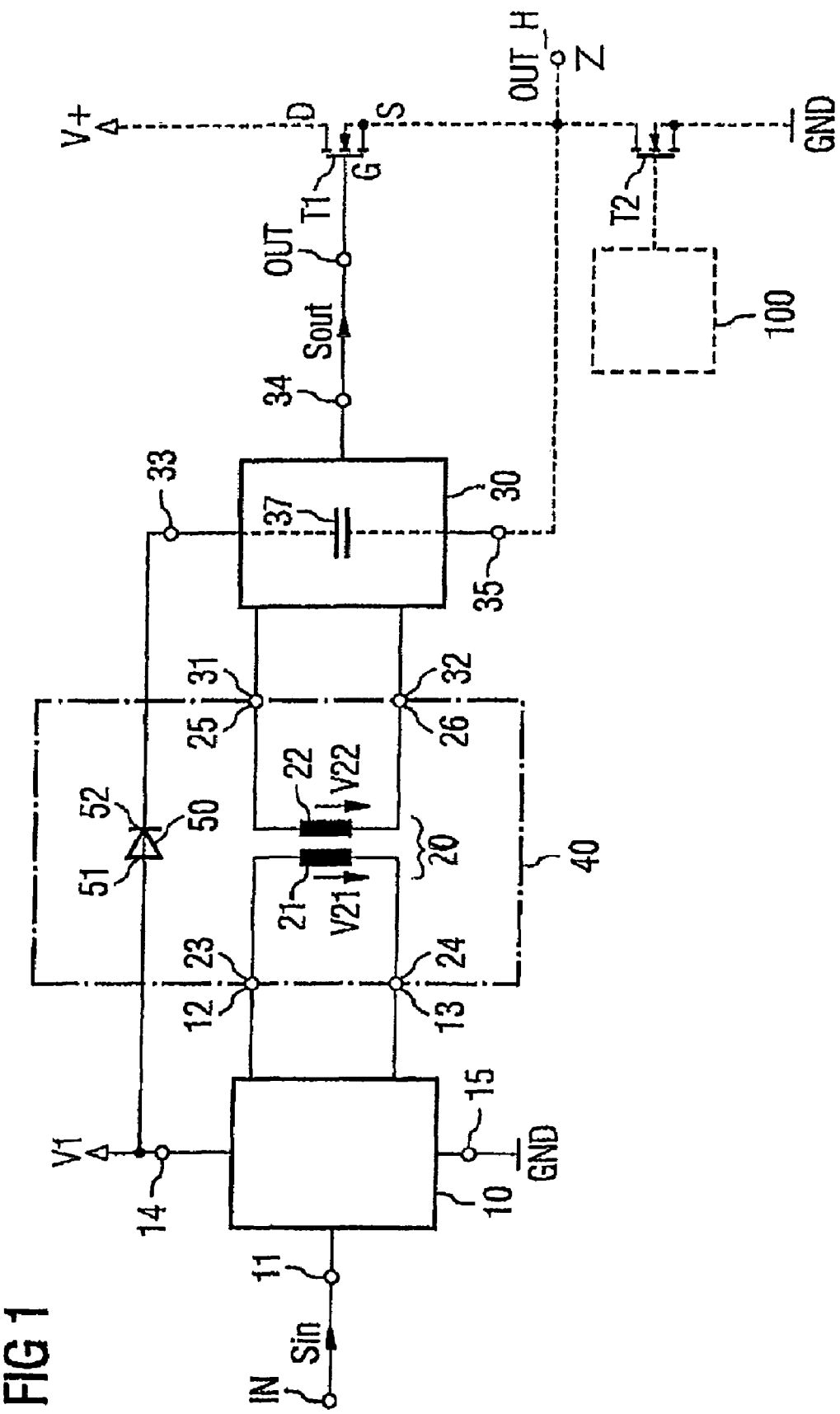
FIG. 1 shows a first exemplary embodiment of a drive circuit according to the invention for driving a semiconductor switching element, which drive circuit has a first and a second driver circuit as well as a transformer, which is arranged between the first and the second driver circuit, and a diode.

FIG. 1 shows one exemplary embodiment of a drive circuit according to the invention for production of a drive signal Sout for a semiconductor switching element. This drive circuit is particularly suitable for driving a semiconductor switching element which is used as a high-side switch in a half bridge and is in the form of a power transistor.

In order to assist understanding of the method of operation of the drive circuit according to the invention, FIG. 1 illustrates a half bridge such as this, which has two power MOSFETs T1, T2, each having a load path (drain-source path) and each having a drive connection (gate connection). The load paths of these two MOSFETs T1, T2 are in this case connected in series between an upper or positive supply potential V+ and a lower or negative supply potential GND. The lower supply potential GND is, in particular, ground potential and is referred to in the following text as the reference ground potential. The upper supply potential V+ is referred to in the following text as the load supply potential.

One output of the half bridge is formed by a node OUT_H which is common to the load paths and to which a load Z can be connected. The half-bridge circuit is in this case used to selectively connect this load Z to the load supply potential V+ or the reference ground potential GND. The power transistors T1, T2 in the example are in the form of n-channel MOSFETs, although IGBTs can also alternatively be provided. n-MOSFETs such as these switch on when a positive drive voltage (gate-source voltage) is applied between their gate and source connections G, S. In order to switch on the first MOSFET T1, which is used as a high-side switch and whose load path is connected between the load supply potential V+ and the output OUT_H, a drive potential is in this case required which must be higher than the source potential of this high-side switch T1 at least by the value of the threshold voltage of this MOSFET T1. Since this source potential can rise approximately to the value of the load supply potential V+ when the high-side switch T1 is switched on, a drive potential which is greater than the load supply potential V+ must be provided in order to switch this high-side switch T1 on.

The drive circuit according to the invention has an input IN for supplying an input signal Sin and an output OUT for production of the drive signal Sout for the high-side switch T1. The drive signal Sout is in this case produced as a function of the input signal Sin which is applied to the input IN.

The drive circuit also has a first driver circuit 10, which is supplied with the input signal Sin at an input 11, and a second driver circuit 30 which makes the drive signal Sout available at an output 34. The input signal Sin is a two-value logic signal, for example with signal levels of 0 V and 3.3 V or 0 V and 5 V, in each case with respect to the reference ground potential, and is produced by a signal processing circuit that is not illustrated in any more detail. The first driver circuit 10 also has supply inputs 14, 15 for application of a supply voltage and of which a first supply input 14 is connected to a first supply potential V1 and of which a second supply input 15 is connected to the reference ground potential GND during operation of the drive circuit.

A transformer 20 having one primary winding 21 and one secondary winding 22 is arranged between the first driver circuit 10 and the second driver circuit 30 and DC-decouples the first and the second driver circuit 10, 30. The transformer is thus used as a potential barrier in order to protect the first driver circuit 10 against high drive potentials which are required in order to switch the high-side switch T1 on and are produced by the second driver circuit 30. Although the transformer 20 isolates the potentials of the first and second driver circuits 10, 30 it does, however, allow signal transmission from the first driver circuit 10 (which is also referred to as a low-side driver circuit) to the second driver circuit 30, which is also referred to as a high-side driver circuit.

The primary winding 21 of the transformer 20 is connected via connections 23, 24 to output connections 12, 13 of the first driver circuit 10. The first driver circuit 10 is designed to supply the primary winding via the output connections 12, 13 with signal pulses which are dependent on the input signal Sin, and which are transmitted to the secondary winding 22 on the basis of the inductive coupling between the primary winding 21 and the secondary winding 22. The second driver circuit 30 has inputs 31, 32 which are connected to connections 25, 26 of the secondary winding 22, and is designed to detect signal pulses applied to the secondary winding 22, and to convert them to the drive signal Sout.

The input signal Sin and the drive signal Sout are normally two-value signals, which each assume one of two possible signal levels depending on whether the semiconductor switching element T1 is intended to be switched on or off. A riseing flank of this signal from a lower signal level (low level) to an upper signal level (high level) predetermines, for example, a time at which the high-side switch T1 is switched on, while a falling flank of this signal from the upper signal level to the lower signal level predetermines, for example, a time at which the high-side switch is switched off.

The first driver circuit 10 is designed to suitably preprocess the two-value input signal Sin for transmission via the transformer 20.

The first driver circuit 10 is designed, for example to apply a positive voltage pulse V21 via the outputs 12, 13 to the primary winding 21 on a rising flank of the input signal Sin, and to apply a negative voltage pulse V21 via the output connections 12, 13 to the primary winding 21 on a falling flank of the input signal Sin. The second driver circuit 30 is designed to detect voltage pulses V22 of different polarity across the secondary winding 22, and to convert them to the two-value drive signal Sout in order to drive the semiconductor switching element T1.

The first driver circuit 10 is preferably designed to repeatedly apply positive voltage pulses at regular or irregular time intervals after a rising flank to the primary winding 21 for as long as the input signal Sin is at an upper signal level and the high-side switch T1 is intended to be switched on. In a corresponding manner, the negative signal pulses are transmitted repeatedly for as long as the input signal Sin is at a lower signal level. This repetition of the signal pulses is used to improve the robustness of the circuit to disturbances, and reduces the risk of an inadvertent state change of the high-side switch.

Furthermore, it is possible to use flank coding or level coding to transmit the switching-on and switching-off information (which is contained in level changes of the input signal Sin) for the high-side switch T1. The switching-on information, for example the rising flank of the input signal Sin, is in this case converted in the first driver circuit to a first signal pattern comprising a number of voltage pulses which are applied to the primary winding 21, and the switching-off information, for example the falling flank of the input signal Sin, is converted to a second signal pattern comprising a number of voltage pulses which are applied to the primary winding 21. The second driver circuit 30 is designed to detect these two different signal patterns and to produce the drive signal Sout as a function of which signal pattern is being received. The two signal patterns may, for example, differ in the number of voltage pulses and/or in the time interval between individual voltage pulses.

The second driver circuit 30 has first and second supply inputs 33, 35 for application of a supply voltage. In the case of the illustrated drive circuit, the first supply input 14 of the first driver circuit 10 and the first supply input 33 of the second driver circuit 30 are coupled to one another via a rectifier element which is in the form of a diode 50, with the anode 51 of this diode 50 being connected to the first supply input 14 of the first driver circuit 10, and thus to the first supply potential V1, and the cathode 52 of the diode 50 being connected to the first supply input 33 of the second driver circuit 30. The diode 50 is in this case part of a so-called bootstrap circuit which, in addition to this diode 50, has a capacitor 37 which is connected between the supply inputs 33, 35 of the second driver circuit 30. A connection of the capacitor 37 that is remote from the diode 50 is connected via the second supply input 35 during operation of the drive circuit to the source connection S of the high-side MOSFET T1 to be driven and to the output OUT_H of the half bridge.

This capacitor 37 is charged via the diode 50 to the value of the first supply voltage V1 minus the on-state voltage across the diode 50 when the potential at the second supply input 35 of the second driver circuit 30 falls below the value of this first supply potential V1, in particular to the value of the reference ground potential GND. This is the situation when the high-side switch T1 is switched off and the second semiconductor switching element T2 (the low-side switch) is switched on by means of a drive circuit 100, which is illustrated only schematically. When the second semiconductor switching element T2 is switched off and the voltage at the output OUT_H of the half bridge rises when the high-side switch T1 is switched on, then the diode 50 prevents discharging of the voltage supply capacitor 37 in the second driver circuit 30.

The voltage supply capacitor 37 provides a floating supply voltage, which is independent of the reference ground potential GND and is related to the output OUT_H of the half bridge, and the source connection S of the high-side switch T1. The amplitude of this supply voltage with respect to the output potential of the half bridge in this case corresponds approximately to the amplitude of the first supply potential V1 with respect to the reference ground potential GND. The second driver circuit 30 is designed to produce the drive signal Sout from this supply voltage on the basis of the voltage pulses which are applied to the inputs 31, 32.

The transformer 20 with the primary winding 21 and the secondary winding 22 as well as the diode 50 are integrated together in one semiconductor body 40, as will be explained in the following text. This ensures a potential barrier in a space-saving manner between the low-side driver 10 and the high-side driver 30 and, furthermore, a voltage supply for the high-side driver 30.

The first and second driver circuits 10, 30 may, for example, be implemented in a manner which is known from the initially mentioned DE 102 05 705 C1.

Figure 2:
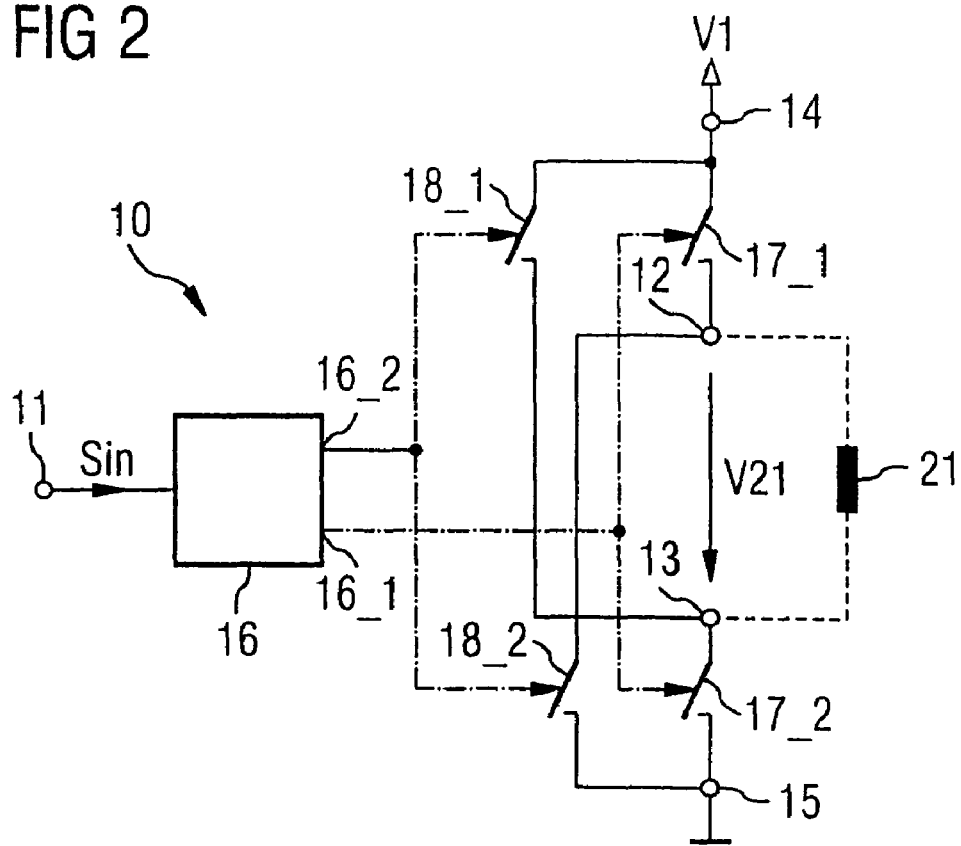
FIG. 2 shows one possible implementation example for the first driver circuit.

FIG. 2 shows, schematically, one exemplary embodiment of a first driver circuit 10 which is designed to produce positive or negative voltage pulses V21 across the primary winding 21 on the basis of the input signal Sin. This driver circuit has an input stage 16 which is designed to produce a first signal pulse at a first output 16_1 on a rising flank of the input signal Sin, and to produce a second signal pulse at a second output 16_2 on a falling flank of the input signal Sin. When a signal pulse occurs at the first output 16_1, a first switch pair 17_1, 17_2 is closed, connecting the first connection 23 of the primary winding 21 to the supply potential V1, and its second connection 24 to the reference ground potential GND, in order to produce a positive voltage pulse across the primary winding 21. When a signal pulse occurs at the second output 16_2, the primary winding 21 is connected via a second switch pair 18_1, 18_2 by the first connection 23 to the reference ground potential GND, and by the second connection 24 to the supply potential V1, in order to produce a negative voltage pulse V21 across the primary winding 21.

The input circuit 16 may be a conventional input circuit for detection of rising and falling flanks, and for production of the signal pulses as a function of these flanks.

Figure 3:
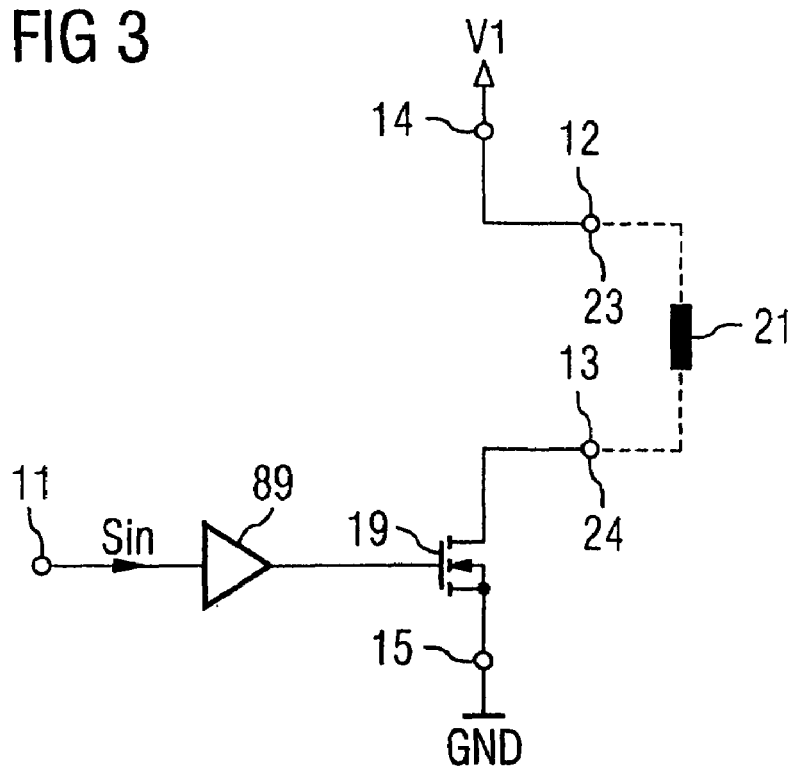
FIG. 3 shows a further possible implementation example for the first driver circuit having a switching element.

FIG. 3 shows one exemplary embodiment of a first driver circuit 10, which is designed to convert a rising flank of the input signal Sin to a first signal pulse sequence, and to convert a falling flank of the input signal Sin to a second signal pulse sequence, which is not the same as the first signal pulse sequence. This driver circuit 10 has only one switching element 19 which, in the example, is in the form of a MOSFET and is connected as a low-side switch in series with the primary winding, that is to say it is connected between the second output 13 and the second supply potential connection, which is at the reference ground potential. This switching element is driven by a circuit 89, to which the input signal Sin is supplied. This circuit 89 may, for example, use frequency modulation, flank or level coding or else the burst pulses for signal transmission. A flank coding method has been known for a long time and is described, for example, in Siemens Technology Report Volume 99, 20 Oct. 2002, page 24. In a method such as this, rising and falling flanks of a movement to be transmitted are converted to different pulse patterns.

FIG. 4 shows one implementation example for a second driver circuit 30. This second driver circuit 30 has an input circuit 36 which is coupled to the inputs 31, 32 and is designed to produce an internal control signal S36, on the basis of which the drive signal Sout is produced.

This input circuit is provided in such a manner that its method of operation is matched to the method of operation of the first driver circuit 10.

When using a first driver circuit as shown in FIG. 2, which produces positive and negative signal pulses, a second driver circuit 30 is used and is designed to detect positive and negative signal pulses at the inputs 31, 32. In this case, by way of example, the input circuit 36 is designed to produce a high level of the internal control signal S36 when a positive signal pulse is detected between the inputs 31, 32, and to produce a low level of the control signal S36 when a negative voltage pulse is detected between the inputs 31, 32.

When using a first driver circuit as shown in FIG. 3, a second driver circuit 30 is used and is matched to the method of operation of the circuit 89 and, for example, is designed to detect different pulse patterns at the inputs when the circuit 89 is carrying out a flank coding process. The input circuit 36 is connected between the supply connections 33, 34, and is thus supplied from the supply voltage V37 that is applied via the bootstrap capacitor.

The internal control signal S36 controls first and second switching elements 39_1, 39_2, a first switching element 39_1 of which is connected between the first supply input 33 and the output 34, while a second switching element 39_2 is connected between the output 34 and the second supply input 35. These two switches 39_1, 39_2 are driven in a complementary manner with respect to one another, as is illustrated in FIG. 3, with an inverter 38 being connected upstream of one of the two switches 39_1. In this context, it should be noted that these switching elements may, in particular, be in the form of transistors. The first switch 39_1 may, in particular, be in the form of a p-MOSFET, and the second switch 39_2 may be in the form of an n-MOSFET. There is no need for the inverter 38 if the second switch 39_2 is in the form of a n-MOSFET.

When the first switch 39_1 is switched on, the high-side switch T1, which is illustrated by dashed lines in FIG. 3, is switched on via the supply voltage V37, which is applied via the bootstrap capacitor 37. When the second semiconductor switching element 39_2 is switched on, the high-side switch is switched off, since its gate-source voltage is in this case approximately zero.

One implementation example for the semiconductor body 40 with the transformer 20 arranged in it and with the bootstrap diode arranged in it, will be explained in the following text with reference to FIGS. 5 and 6. In this case, FIG. 5 shows a side view of a cross section through the semiconductor body, while FIG. 6 shows a cross section along the section plane B-B as shown in FIG. 5.

The semiconductor body 40 has a semiconductor substrate 41 with a front face 401 and a rear face 402. In order to provide the transformer, two metallization layers are provided in an isolator layer or dielectric layer 42 above the front face 401, and are arranged at a distance from one another in the vertical direction. A conductor structure 21, 22 which runs in a spiral shape when seen in a plan view is provided in each of these metallization layers. These first and second conductor structures 21, 22 form the primary winding and the secondary winding of the transformer, and are thus annotated with the same reference symbols as the primary winding and the secondary winding in FIG. 1.

The conductor structure 21 which forms the primary winding is arranged between a first and a second isolator layer 421, 423, of which the first isolator layer 421 is applied to the front face 401 of the semiconductor substrate 41. The first conductor structure 21 is applied to and structured on the isolator layer 421. The second conductor layer 22 is arranged above the second isolator layer 423.

The isolator layers 421, 423 are composed, for example, of a deposited oxide, for example, TEOS, while the conductor structures are composed, for example, of a metal or of a heavily doped polysilicon.

The first interconnect structure 21, which is arranged buried in the isolator layer 42, has contact made with it by means of contact elements 45, 46, which extend in the vertical direction through the second isolator layer 423 as far as the connections of the first interconnect structure 21, and each have connecting pads on the second isolation layer 423. These connecting pads form the first and second connections 23, 24 of the primary winding.

The second interconnect structure 22, which forms the secondary winding of the transformer, likewise has connecting pads on the second isolation layer 423, which are arranged on a section plane that is offset with respect to that illustrated in FIG. 5, and are illustrated in FIG. 6. These connecting pads form the first and second connections 25, 26 of the secondary winding.

The second interconnect structure 44, which is arranged on the second isolation layer 423, is illustrated in a shaded form in FIG. 6. The first interconnect structure 43, which is arranged underneath this, is illustrated by dashed lines in FIG. 6. The two transformer windings in the example each have the same number of turns, although they may also have different numbers of turns.

With reference to FIG. 5, a diode is provided in the semiconductor substrate 43 by providing a semiconductor zone 47, of complementary doping to the basic doping of the semiconductor substrate 41, in the area of the front face 401. This semiconductor zone 47 may be produced by means of conventional doping steps before the application of the isolation layer 43 and the production of the interconnect structures 21, 22. In the example, the semiconductor substrate 41 has n-basic doping, while the semiconductor zone 47 is p-doped. The semiconductor substrate 41 in this case forms the cathode zone of the diode, while the semiconductor zone 47 forms its anode zone. The anode zone 47 is connected to the connecting pad 23 above the second isolation layer 423 via the contact element 45 of the first interconnect structure 21, a section of this first interconnect structure 21 as well as a further contact element 48, which is embedded in the first isolation layer 421. This connecting pad 23 thus at the same time forms one of the connections of the primary winding 21 of the transformer, and the anode connection 51 of the diode (50 in FIG. 1).

This implementation of the transformer and of the diode as illustrated in FIG. 5 is suitable for the use of a driver circuit as shown in FIG. 3, in which the first connection 23 of the primary winding 21 of the transformer is permanently connected to the first supply connection 14 of the first driver circuit.

FIG. 7 shows one possible implementation of the drive circuit illustrated in FIG. 1, at chip level. The reference symbol 40 denotes the semiconductor body in FIG. 6, in which the transformer 20 together with the diode 50 is integrated. The reference symbol 71 denotes a second semiconductor body, in which the first driver circuit 10 is integrated, and the reference symbol 72 denotes a third semiconductor body, in which the second driver circuit 30 is integrated. The second semiconductor body 71 is applied with the first driver circuit 10 to a first electrically conductive mount element, which is also referred to as a leadframe. This second semiconductor body 71 has contact pads 12, 13, 14, 15 in the area of its front face facing away from the leadframe 61, which carry out the function of the first and second outputs as well as the function of the first and second supply inputs of the driver circuit 10 as shown in FIG. 1, and are denoted with the corresponding reference symbols.

The first and second outputs 12, 13 of the driver circuit 10 are connected via bonding wires 63, 64 to connecting pads 23, 24 for the first and second connection of the primary winding on the first semiconductor body 40. The connecting pad 23 may at the same time form the anode connection of the diode which is integrated in the first semiconductor body 40, as is illustrated in FIG. 3. The first semiconductor body 40 and the third semiconductor body 72 are applied by their rear faces in an electrically conductive matter on the second leadframe 62. The second leadframe 62 thus short-circuits the cathode zone of the diode which (with reference to FIG. 5) is formed by the semiconductor substrate 41 of the first semiconductor body 40, and the first supply input 33 of the second driver circuit 30, which is formed by the rear face of the third semiconductor chip 72. In order to reduce the contact resistance between the substrate 41 of the first semiconductor body 40 and the second leadframe 62, the substrate preferably has a heavily doped connecting zone 49 in the area of its rear face, as is illustrated by dashed lines in FIG. 5.

The first and second signal inputs 31, 32 of the second driver circuit 30 are arranged in the area of the front face of the third semiconductor chip 72, and are connected via bonding wires 65, 66 to the first and second connections 25, 26 of the secondary winding on the front face of the first semiconductor body 40. The output connection 34 and the second supply input 35 of the second driver circuit 30 are likewise provided by connecting pads in the area of the front face of the third semiconductor chip 72.

The two leadframes 61, 62 with the semiconductor bodies applied to them are preferably arranged in a common chip package, which is illustrated by dashed-dotted lines in FIG. 6 and is formed, for example, by extrusion coating of the leadframes 61, 62 together with the semiconductor chips 40, 71, 72, using a packaging compound or an encapsulation compound.

Figure 8:
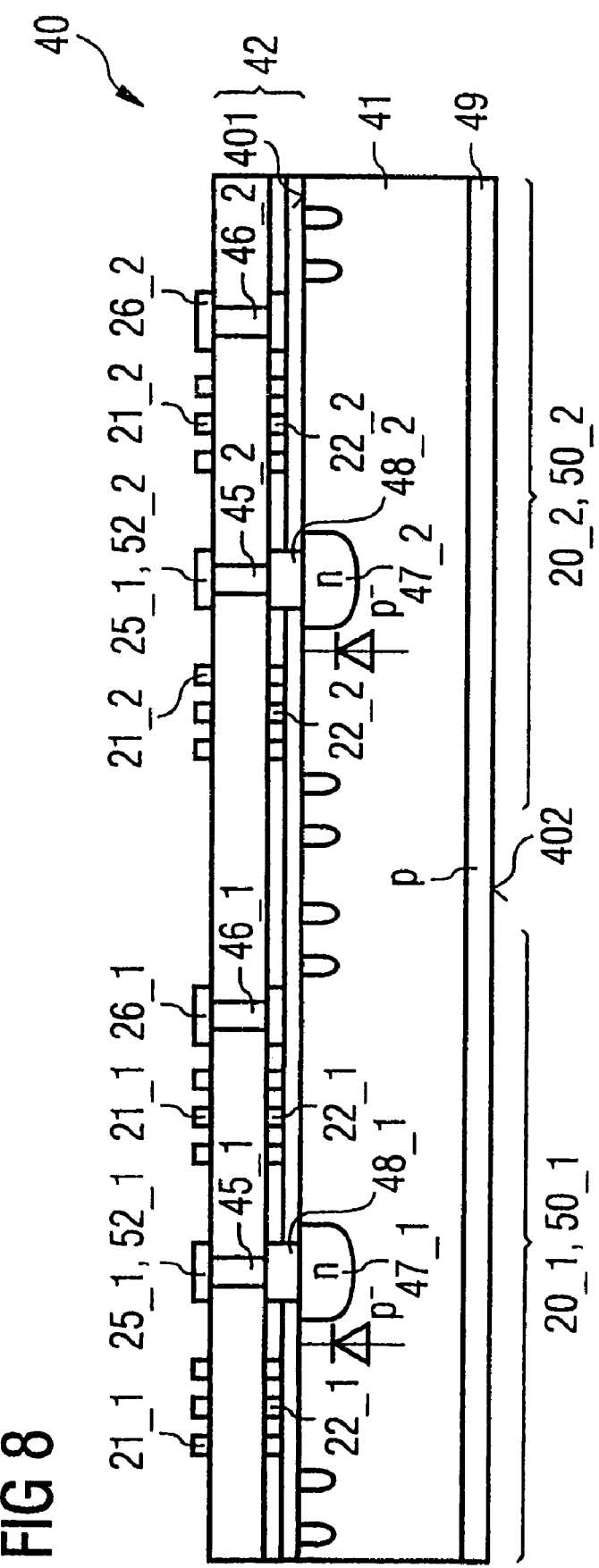
FIG. 8 shows, in the form of a side view, a cross section through a semiconductor body having two transformers integrated in it and having two rectifier elements which are integrated in it and are in the form of diodes.

FIG. 8 shows a side view of a cross section through the first semiconductor body 40, in which two planar, coreless transformers 20_1, 20_2 and two vertical diodes 50_1, 50_2 are integrated. The configuration of each structure with a transformer and a diode corresponds to the configuration explained with reference to FIG. 5, with the two structures being arranged alongside one another in the lateral direction. The arrangement in FIG. 8 differs from that illustrated in FIG. 5 in that the semiconductor substrate 41 has p-basic doping, with a p-doped connecting zone 49 optionally being provided in the area of the rear face 402 of the semiconductor substrate, and being more heavily doped than the basic doping. The semiconductor substrate and this connecting zone 49 in this case form the anode zone of the two diodes 50_1, 50_2. Cathode zones of these two diodes are provided by n-doped semiconductor zones in the area of the front face 401 of the semiconductor substrate.

In the arrangement illustrated in FIG. 8, the interconnect structures which are arranged closer to the semiconductor substrate 41 in the isolation layer 42 form secondary windings 22_1, 22_2 of the transformers 20_1, 20_2. Contact is in this case made with the cathode zones 47_1, 47_2 via first connections 25_1, 25_2 of the secondary windings. These connections 25_1, 25_2 are arranged above the isolation layer 42 and are connected to the second windings 22_1, 22_2 and to the cathode zones 47_1, 47_2 via contact elements 45_1, 45_2 as well as 48_1, 48_2, which extend into the isolation layer 42 in the vertical direction.

Interconnect structures which form the primary windings of the transformers 21_1, 21_2 are in this case arranged above the isolation layer 42. The primary windings 21_1, 21_2 likewise have connecting contacts, although these are not illustrated in the section illustration shown in FIG. 8.

Figure 9:
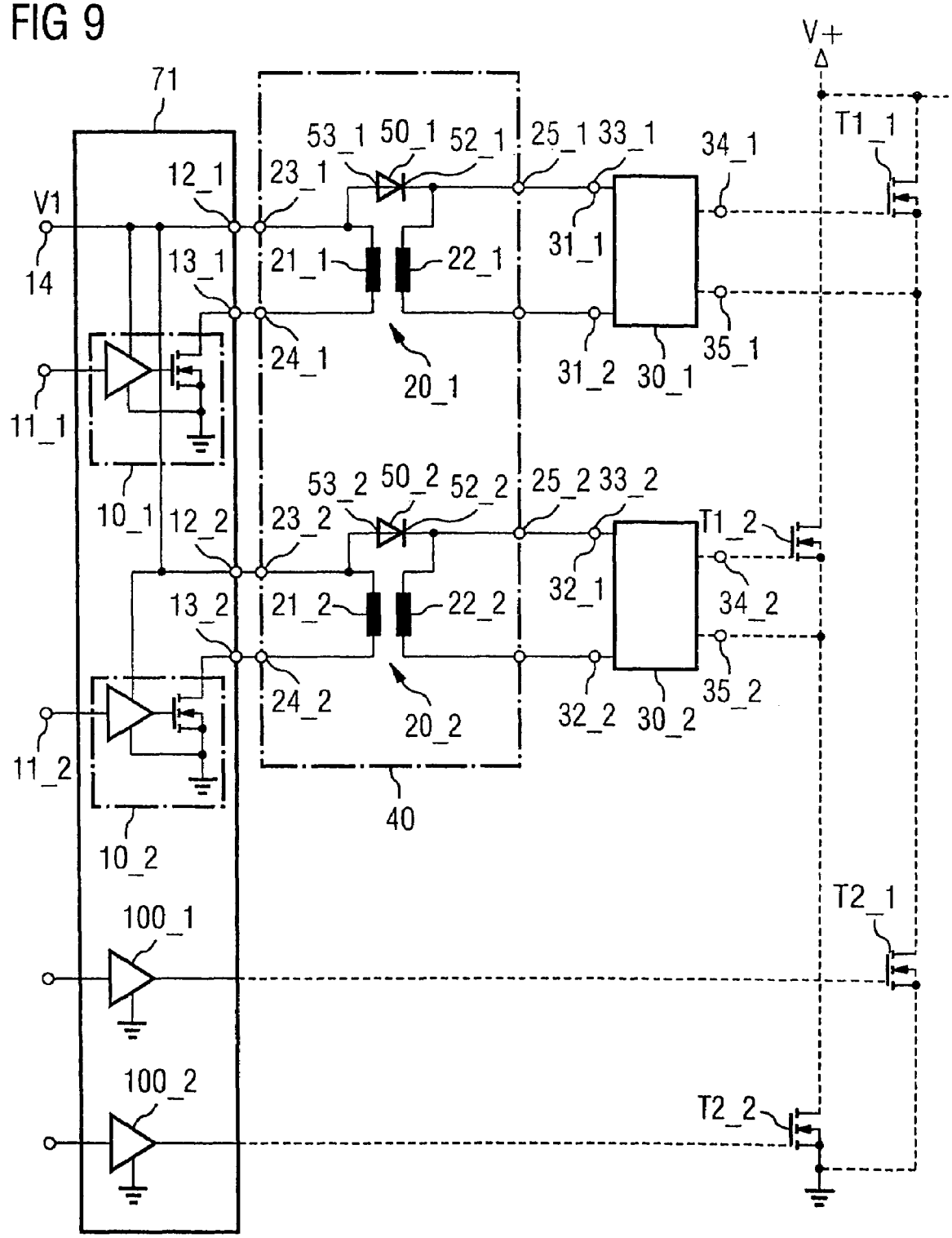
FIG. 9 shows one exemplary embodiment of a drive circuit according to the invention, which has two first driver circuits, two transformers and two rectifier elements as well as two second driver circuits.

The arrangement illustrated in FIG. 8 with in each case two transformers integrated in the semiconductor body 40 and two vertical diodes integrated in the semiconductor body is suitable for the provision of a drive circuit, as illustrated in FIG. 9, for an H bridge or a full bridge. This H bridge has two half bridges, which each have two power MOSFETs or power IGBTs, whose load paths are connected in series between a load supply potential V+ and the reference ground potential GND. The high-side transistors T1_1, T1_2 are driven by two second driver circuits 30_1, 30_2, which each drive one of these two high-side transistors T1_1, T1_2. The second driver circuits 30_1, 30_2 each have first and second signal inputs 31_1, 31_2 and 32_1, 32_2, respectively, which are connected to the respective first and second connections 25_1, 26_1 and 25_2, 26_2 of the secondary windings 22_1, 22_2. The first signal inputs 31_1, 32_1 in this case at the same time form the first supply inputs 33_1, 33_2 of the second driver circuits 30_1, 30_2, to which the cathode connections 52_1, 52_2 of the diodes 50_1, 50_2 are connected.

In the drive circuit illustrated in FIG. 9, the anode connections 53_1, 53_2 are connected to the first connections 23_1, 23_2 of the primary windings 21_1, 21_2.

Each of the primary windings 21_1, 21_2 is connected to a first driver circuit 10_1, 10_2, in which case these two driver circuits can be provided in a corresponding manner to the driver circuit explained with reference to FIG. 3, and they each have a signal input 11_1, 11_2 for supplying an input signal Sin_1, Sin_2, and outputs 12_1, 13_1 and 12_2, 13_2, respectively, for connection to the primary windings 21_1, 21_2. The first driver circuits 10_1, 10_2 are, for example, integrated in a common semiconductor body 71, as is illustrated in FIG. 8 by a dashed line surrounding the driver circuits 10_1, 10_2. Furthermore, driver circuits 100_1, 100_2 for the low-side transistors T2_1, T2_2 for the H bridge can be integrated in this semiconductor body 71.

Figure 10:
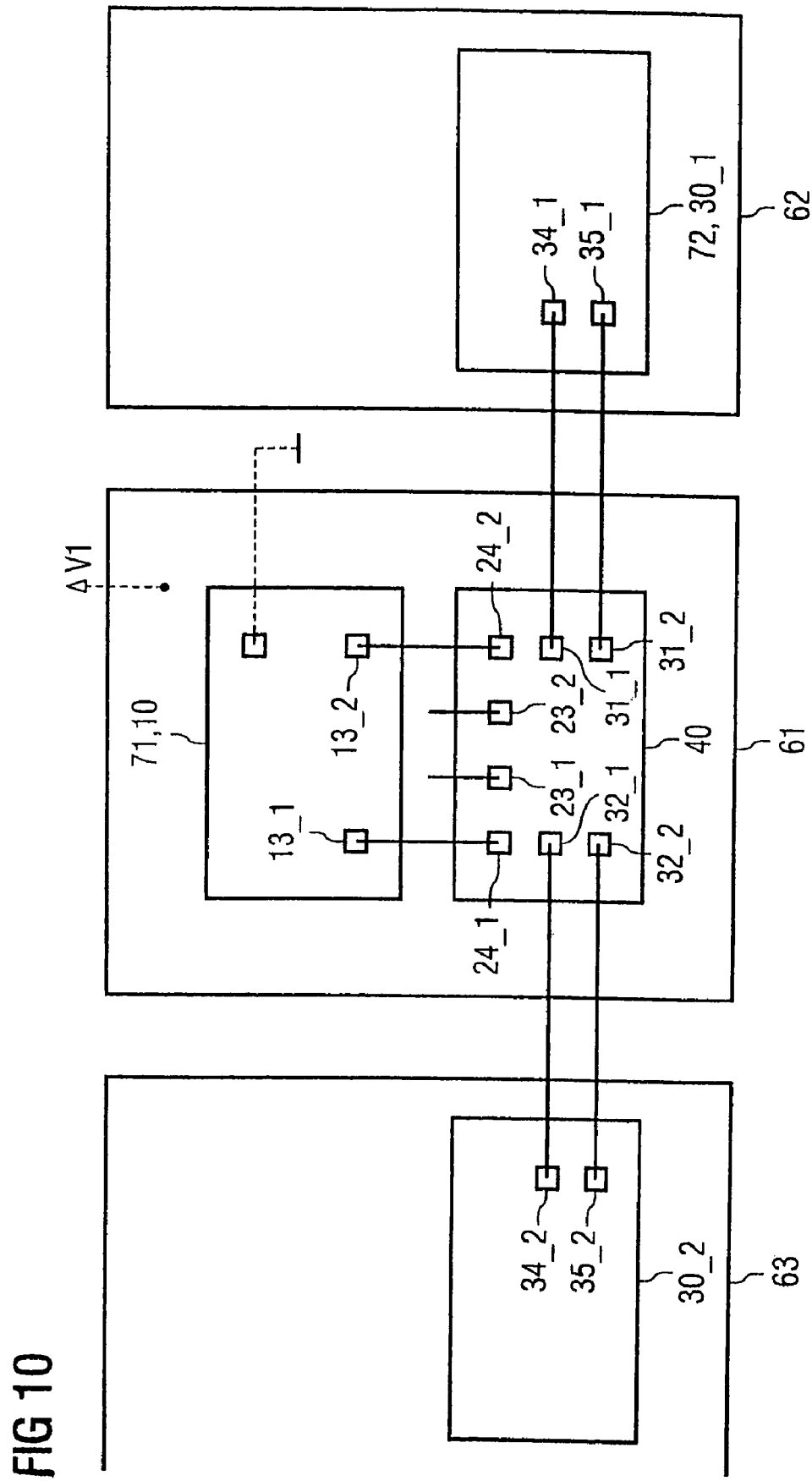
FIG. 10 shows one implementation example for the drive circuit illustrated in FIG. 9, at chip level.

FIG. 10 shows an implementation example for the drive circuit, as illustrated in FIG. 9, at chip level. The first semiconductor body 40 with the two transformers integrated in it and with the two diodes integrated in it is in this case arranged together with the second semiconductor chip 71, in which the first driver circuits 10_1, 10_2 are integrated, on a common first leadframe 61. The first supply input 14, which is shared by the two first driver circuits (10_1, 10_2 in FIG. 9) is in this case formed by the rear face of the second semiconductor chip 71, facing the first leadframe 61. The leadframe 61 is in this case at the first supply potential, as is illustrated by dashed lines in FIG. 10. The first semiconductor chip 40 is applied with its rear face (which forms a common anode connection for the two diodes which are integrated in the semiconductor body) in an electrically conductive manner on the first leadframe 61, as a result of which the anodes of the two diodes are at the first supply potential V1.

The second output connections 13_1, 13_2 of the first driver circuits are connected via bonding wires to the second connections 24_1, 24_2 of the primary windings (21_1, 21_2 in FIG. 8). The first connections 23_1, 23_2 of these primary windings are in this case connected via further bonding wires to the first leadframe 61, and are connected via these bonding wires to the first supply potential V1 and to the anodes of the associated diodes. The cathode connections (52_1, 52_2 in FIG. 8) of the diodes are connected to the first connections (25_1, 25_2) of the secondary windings via wiring layers, which are not illustrated in any more detail, in the chip 40.

The transformers in FIGS. 5 and 8 are in the form of planar, coreless transformers, that is to say without a transformer core. However, it is also possible in a manner that is not illustrated in any more detail for the planar transformers to be provided with a core, which acts as an amplifier for the magnetic flux. This core may, for example, be formed by a cobalt layer. With respect to the example in FIGS. 5 and 6, this layer can be arranged in an area which is surrounded by the windings. In the vertical direction, this layer may extend over the two metallization layers, in which windings 21, 22 are arranged.

The invention claimed is:

1. A drive circuit for a semiconductor switching element, the drive circuit producing a drive signal based on an input signal, the drive circuit comprising:
    a transformer having a primary winding and a secondary winding, the transformer integrated in a first semiconductor body,
    a first driver circuit coupled to receive the input signal, the first driver circuit having at least one output which is coupled to the primary winding of the transformer and a first supply input connected to receive a first supply potential,
    a second driver circuit operable to provide the drive signal and having at least one input coupled to the secondary winding, the second driver circuit having a second supply input, and
    a rectifier element connected between the first and the second supply input, and integrated in the first semiconductor body.

2. The drive circuit as claimed in claim 1, wherein:
    the first driver circuit is integrated in a second semiconductor body; and
    the second driver circuit is integrated in a third semiconductor body.

3. The drive circuit as claimed in claim 2, wherein the first and second semiconductor bodies are arranged on a common mount.

4. The drive circuit as claimed in claim 2, wherein the first and third semiconductor bodies are arranged on a common mount.

5. The drive circuit as claimed in claim 1, wherein the rectifier element is in the form of a power diode with an anode connection and a cathode connection in the first semiconductor body.

6. The drive circuit as claimed in claim 5, wherein:
    the primary coil includes a spiral shape portion that extends around a central area; and
    the anode connection or the cathode connection is disposed in the central area.

7. The drive circuit as claimed in claim 1, wherein the rectifier element includes a first emitter of a first conductance type, a second emitter of a second conductance type and a base of the first or second conductance type, which is arranged between the first and the second emitter and is more lightly doped than the first and second emitters.

8. The drive circuit as claimed in claim 1, wherein the transformer is in the form of a planar transformer.

9. The drive circuit as claimed in claim 1, wherein
    the drive circuit has a plurality of outputs for driving a number of semiconductor switching elements, and further comprising:
    a number of first driver circuits corresponding to the number of outputs,
    a number of transformers and rectifier elements corresponding to the number of outputs, and integrated in the first semiconductor body, and
    a number of second driver circuits corresponding to the number of outputs.

10. The drive circuit as claimed in claim 2, wherein the first, second and third semiconductor bodies are arranged in a common chip package.

11. A circuit arrangement, comprising:
    a drive circuit, the drive circuit producing a drive signal based on an input signal, the drive circuit including
        a transformer having a primary winding and a secondary winding, the transformer integrated in a first semiconductor body,
        a first driver circuit coupled to receive the input signal, the first driver circuit having at least one output which is coupled to the primary winding of the transformer and a first supply input connected to receive a first supply potential,
        a second driver circuit operable to provide the drive signal and having at least one input coupled to the secondary winding, the second driver circuit having a second supply input, and
        a rectifier element connected between the first and the second supply input, and integrated in the first semiconductor body; and
    a semiconductor switching element operably coupled to be driven by the drive signal.

12. The circuit arrangement of claim 11, wherein the semiconductor switching element and the drive circuit are arranged in a common package.

13. The drive circuit as claimed in claim 12, wherein the rectifier element is in the form of a power diode with an anode connection and a cathode connection in the first semiconductor body.

14. The drive circuit as claimed in claim 13, wherein:
    the primary coil includes a spiral shape portion that extends around a central area; and
    the anode connection or the cathode connection is disposed in the central area.

15. The drive circuit as claimed in claim 12, wherein the transformer is in the form of a planar transformer.

16. The drive circuit as claimed in claim 11, wherein
    the drive circuit has a plurality of outputs for driving a number of semiconductor switching elements, and further comprising:
    a number of first driver circuits corresponding to the number of outputs,
    a number of transformers and rectifier elements corresponding to the number of outputs, and integrated in the first semiconductor body, and
    a number of second driver circuits corresponding to the number of outputs.

17. A method of producing a drive signal based on an input signal, comprising:

providing the input signal to a first driver circuit having at least one output which is coupled to a primary winding of a transformer, the transformer integrated in a first semiconductor body;

providing a first supply potential to a first supply input of the first driver circuit;

generating the drive signal in a second driver circuit, the second driver circuit having at least one input coupled to a secondary winding of the transformer, the second driver circuit having a second supply input coupled to a rectifier element, the rectifier element connected between the first and the second supply inputs and integrated in the first semiconductor body.

18. The method as claimed in claim 17, further comprising:

providing a first voltage to a semiconductor switch load path, the semiconductor switch load path coupled to a load path of a second semiconductor switch.

19. The method as claimed in claim 18, further comprising employing the first driver circuit to generate pulses based on the input signal.

20. The method as claimed in claim 17, further comprising employing the first driver circuit to generate pulses based on the input signal.

* * * * *